(12) United States Patent
Matsuyama et al.

(10) Patent No.: US 11,340,302 B2
(45) Date of Patent: May 24, 2022

(54) TEST METHOD AND MANUFACTURING METHOD FOR ELECTRICAL STORAGE DEVICE

(71) Applicant: TOYOTA JIDOSHA KABUSHIKI KAISHA, Toyota (JP)

(72) Inventors: Yoshio Matsuyama, Nisshin (JP); Ruri Tanaka, Toyota (JP); Kiwamu Kobayashi, Anjyo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 89 days.

(21) Appl. No.: 17/033,021

(22) Filed: Sep. 25, 2020

(65) Prior Publication Data

US 2021/0173013 A1 Jun. 10, 2021

(30) Foreign Application Priority Data

Dec. 4, 2019 (JP) .............................. JP2019-219699

(51) Int. Cl.
| | |
|---|---|
| G01R 31/00 | (2006.01) |
| G01R 31/385 | (2019.01) |
| G01R 31/367 | (2019.01) |
| H01M 4/04 | (2006.01) |
| H01M 10/48 | (2006.01) |
| G01R 31/374 | (2019.01) |

(52) U.S. Cl.
CPC ....... *G01R 31/3865* (2019.01); *G01R 31/367* (2019.01); *G01R 31/374* (2019.01); *H01M 4/0447* (2013.01); *H01M 10/482* (2013.01)

(58) Field of Classification Search
USPC ................................ 324/426, 431, 433–435
See application file for complete search history.

(56) References Cited

U.S. PATENT DOCUMENTS

| | | | |
|---|---|---|---|
| 2019/0198942 A1 | 6/2019 | Kobayashi et al. | |
| 2019/0250216 A1 | 8/2019 | Kobayashi et al. | |
| 2020/0025831 A1* | 1/2020 | Goto ................. | H01M 10/4285 |

FOREIGN PATENT DOCUMENTS

| | | |
|---|---|---|
| JP | 2019-113450 A | 7/2019 |
| JP | 2019-138757 A | 8/2019 |

* cited by examiner

*Primary Examiner* — Vincent Q Nguyen
(74) *Attorney, Agent, or Firm* — Oliff PLC

(57) ABSTRACT

By a first energization process of applying a voltage with the power supply to cause a current for charging the electrical storage device to flow through the circuit and a second energization process of, when a transition condition is satisfied during the first energization process, decreasing the voltage of the power supply to cause the current to further flow, a condition of an electrical storage is determined. An effective resistance value of the circuit is set to 0.1Ω or below. A decrease in the voltage of the power supply in transition from the first energization process to the second energization process is set such that the effective resistance value in the second energization process is an intermediate value between a parasitic resistance value of the circuit and the effective resistance value in the first energization process.

6 Claims, 6 Drawing Sheets

TEST METHOD AND MANUFACTURING METHOD FOR ELECTRICAL STORAGE DEVICE

INCORPORATION BY REFERENCE

The disclosure of Japanese Patent Application No. 2019-219699 filed on Dec. 4, 2019 including the specification, drawings and abstract is incorporated herein by reference in its entirety.

BACKGROUND

1. Technical Field

The disclosure relates to a test method for determining a condition of an electrical storage device. More specifically, the disclosure relates to a test method for an electrical storage device, which is capable of quickly determining a condition of an electrical storage device based on an amount of discharge current, other than a decrease in voltage, of the electrical storage device. The disclosure also relates to a manufacturing method for an electrical storage device, which includes the test method for an electrical storage device as part of a process.

2. Description of Related Art

Various test methods have been suggested to determine the conditions of secondary batteries and other electrical storage devices so far. Japanese Unexamined Patent Application Publication No. 2019-113450 (JP 2019-113450 A) describes one example of the various test methods. The technique described in JP 2019-113450 A determines the condition of an electrical storage device under test based on a state of convergence of a current flowing through a circuit composed of the electrical storage device and an external power supply. This technique is suggested as an alternative to a former determination technique by means of voltage measurement, which takes a long time for determination. As is referred to in JP 2019-113450 A, this type of test method may be employed as a step in a manufacturing method.

SUMMARY

However, the above-described existing technique has the following inconvenience. The technique described in JP 2019-113450 A basically measures a current with a tendency to increase a voltage value of the external power supply. In JP 2019-113450 A, consideration is made with the concept of an imaginary resistance having a negative or zero resistance value. Thus, the measured current is considered by just like using a model in which the voltage value of the external power supply is made constant and a parasitic resistance of the circuit reduces instead. Of course, reducing the parasitic resistance actually means increasing the voltage value of the external power supply.

To converge the circuit current earlier, it is better to reduce a parasitic resistance obtained by subtracting the above imaginary resistance. However, if the resultant parasitic resistance is too close to zero, the stability of the circuit current deteriorates. In other words, the circuit current significantly changes for a slight voltage change due to a disturbance, such as a change in environmental temperature (see FIG. 1 for the relationship between a battery temperature and a battery voltage). For this reason, a time that is taken until the convergence is determined is actually not so shortened. On the other hand, in a state where the resultant parasitic resistance is large, the convergence of the circuit current takes time even when there is no disturbance.

The disclosure provides a test method and a manufacturing method for an electrical storage device, which are capable of quickly determining a condition of the electrical storage device regardless of disturbance factors.

An aspect of the disclosure relates to a test method for determining a condition of an electrical storage device under test based on a circuit current flowing through a circuit composed of the electrical storage device and a power supply connected to the electrical storage device. The test method includes a first energization process of applying a voltage with the power supply to cause a current for charging the electrical storage device to flow through the circuit composed of the charged electrical storage device and the power supply, and a second energization process of, when a predetermined transition condition is satisfied while the first energization process is being performed, decreasing the voltage of the power supply to cause the current to further flow. By using a concept of an imaginary resistance value when a model in which it is assumed that the voltage output from the power supply in the first energization process is equal to a voltage of the electrical storage device and, instead, an imaginary resistance having a zero or negative resistance value is present in series with a parasitic resistance of the circuit and an absolute value of the imaginary resistance value is increased, an effective resistance value, which is a sum of the parasitic resistance value of the circuit and the imaginary resistance value, is set to $0.1\Omega$ or below. A decrease in the voltage of the power supply in transition from the first energization process to the second energization process is set such that the effective resistance value in the second energization process is an intermediate value between the parasitic resistance value of the circuit and the effective resistance value in the first energization process. The condition of the electrical storage device is determined in the second energization process.

In the test method for an electrical storage device in the above aspect, the first energization process is performed in a state where the voltage of the power supply is considerably higher than the voltage of the electrical storage device itself. Thus, a convergence of the circuit current is facilitated. On the other hand, a small effective resistance value of the circuit means that the circuit current is sensitive to a disturbance and easily fluctuates. Therefore, when the predetermined transition condition is satisfied while the first energization process is being performed, the process transitions into the second energization process. The fact that the transition condition is satisfied means that, without fluctuations in the circuit current, a convergence of the circuit current is approaching.

The voltage of the power supply is decreased at the time of transition from the first energization process into the second energization process. A decrease at that time is set such that the effective resistance value in the second energization process is an intermediate value between the parasitic resistance value of the circuit and the effective resistance value in the first energization process. In other words, the voltage of the power supply in the second energization process is made lower than the voltage during the first energization process but the voltage is set to a value higher by a certain degree than the voltage of the electrical storage device itself. Thus, in the second energization process, facilitation of convergence is relatively moderate; however, the circuit current withstands a disturbance and is less likely to fluctuate. With this configuration, while a required processing time in total of the first energization process and the second energization process is shortened, it is possible to highly accurately determine the condition based on the stable current value in the second energization process. Determining the condition of the electrical storage device in the second energization process means that determination may be performed in the middle of the second energization process or may be performed after termination of the second energization process based on the circuit current value obtained during the second energization process.

In the test method for an electrical storage device in the aspect, the transition condition may include one or two or more of a condition in which an elapsed time from a start of the first energization process has reached a predetermined transition reference value, a condition in which an absolute value of the circuit current has reached a predetermined transition reference value in the first energization process, a condition in which a rate of increase per unit time in the circuit current becomes lower than a predetermined transition reference value in the first energization process, and a condition in which a rate of change per unit time in temperature of the electrical storage device has reached a predetermined transition reference value in the first energization process.

Each of an elapsed time, an absolute value of the circuit current, and a rate of increase per unit time in circuit current itself can be information for determining a convergence of the circuit current. A rate of change in temperature of the electrical storage device is information indicating that there is a disturbance that causes the circuit current to fluctuate. Thus, these pieces of information may be used as the transition condition.

In the test method for an electrical storage device in the aspect, a group of electrical storage devices may be subjected to the first energization process at a time. In this case, the transition condition may include one or both of a condition in which a value of the circuit current becomes different by a predetermined termination reference value or more from a representative value in the group in the first energization process, and a condition in which a standard deviation of a value of the circuit current in the group has reached a predetermined transition reference value in the first energization process.

The fact that the circuit current is far from the others in the group means that only that electrical storage device receives some sort of disturbance and fluctuations in the circuit current may increase later. Alternatively, the electrical storage device may be a defective product. A situation in which variations among circuit currents in the group are large indicates that the circuit currents receive some sort of disturbance and fluctuations in the circuit currents may increase later.

In the test method for an electrical storage device in the aspect, when a predetermined termination condition is satisfied while the second energization process is being performed, the second energization process may be terminated, and the condition of the electrical storage device may be determined based on a value of the circuit current during the second energization process, and the termination condition may include one or two of a condition in which an elapsed time from a start of the first energization process or a transition into the second energization process has reached a predetermined termination reference value, and a condition in which a rate of increase per unit time in the circuit current becomes lower than a predetermined termination reference value in the second energization process. An elapsed time and a rate of increase in circuit current each are also used as information indicating a convergence of circuit current to such a degree sufficient to determine the condition.

In the test method for an electrical storage device in the aspect, a group of electrical storage devices may be subjected to the first energization process and the subsequent second energization process at a time, and the termination condition may include one or both of a condition in which a value of the circuit current becomes different by a predetermined termination reference value or more from a representative value in the group in the second energization process, and a condition in which a standard deviation of a value of the circuit current in the group has reached a predetermined transition reference value in the second energization process. The fact that the circuit current is far from the others in the group significantly means that the electrical storage device may be a defective product. A situation in which variations in circuit currents in the group are large significantly means that a defective electrical storage device may be included in the group.

A manufacturing method for an electrical storage device according to another aspect of the disclosure includes an initial charging process of initially charging an assembled uncharged electrical storage device to a predetermined state of charge to obtain a charged electrical storage device, and a test process of testing the charged electrical storage device. In the test process, any one of the above-described test methods is performed. Thus, it is possible to manufacture an electrical storage device while a time for the test process is shortened.

With the above configuration, a test method and a manufacturing method for an electrical storage device, which are capable of quickly determining a condition of the electrical storage device regardless of disturbance factors, are provided.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
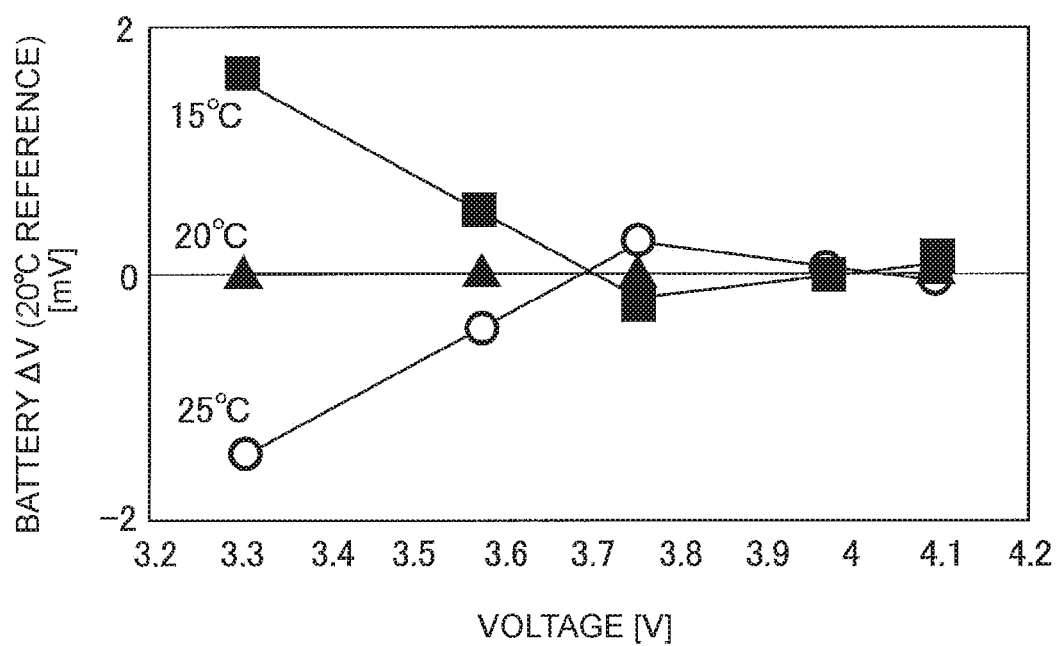
FIG. 1 is a graph showing a relationship between a battery temperature and a change in battery voltage.
Figure 2:
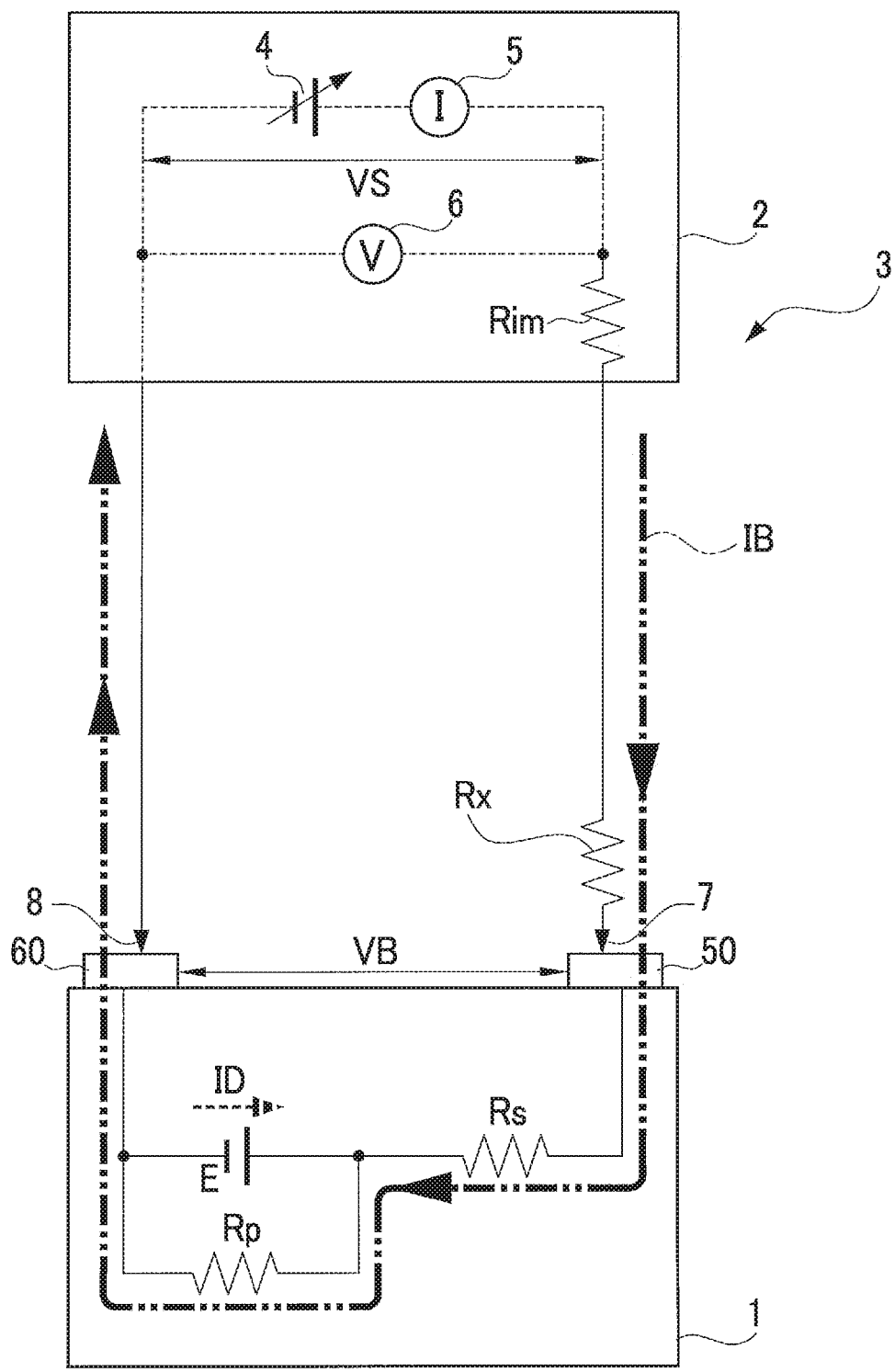
FIG. 2 is a circuit diagram showing the configuration of a circuit assembled to perform a test method for a secondary battery in an embodiment.

Hereinafter, an example embodiment of the disclosure will be described in detail with reference to the accompanying drawings. As shown in FIG. 2, a test method for an electrical storage device according to the present embodiment is performed in a state where a circuit 3 is assembled by connecting a measuring device 2 to a secondary battery 1 that is an electrical storage device to be tested. First, the basic principle of the test method for the secondary battery 1 with the measuring device 2 will be described.

Figure 3:
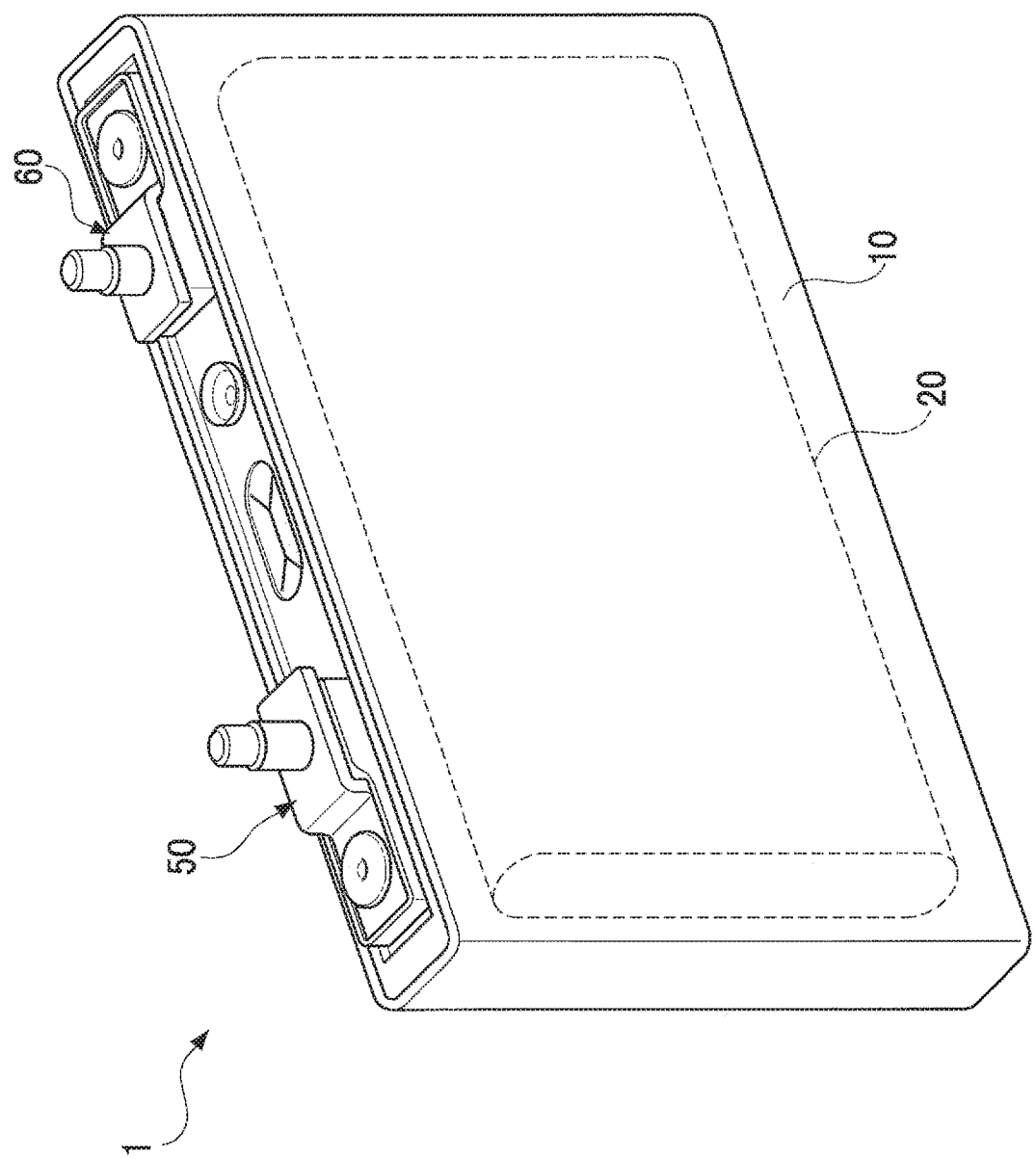
FIG. 3 is an appearance view showing an example of a secondary battery to be tested in the embodiment.

Although the secondary battery 1 is schematically shown in FIG. 2, the secondary battery 1 actually has a flat square appearance as shown in, for example, FIG. 3. The secondary battery 1 of FIG. 3 is made by accommodating an electrode stack 20 in an outer case 10. The electrode stack 20 is made such that a positive plate and a negative plate are stacked via a separator. An electrolyte is also accommodated inside the outer case 10 in addition to the electrode stack 20. Positive and negative terminals 50, 60 are provided on the outer surface of the secondary battery 1. The secondary battery 1 is not limited to the flat square one as shown in FIG. 3 and may have another shape, such as a cylindrical shape.

FIG. 2 will be further described. FIG. 2 schematically shows the secondary battery 1. The secondary battery 1 in FIG. 2 is shown as a model composed of an electromotive element E, an internal resistance Rs, and a short-circuit resistance Rp. The internal resistance Rs is connected in series with the electromotive element E. The short-circuit resistance Rp is a model of an electrically conductive path made by micro metal foreign substances that may be contained in the electrode stack 20 and is connected in parallel with the electromotive element E.

The measuring device 2 includes a direct-current power supply 4, an ammeter 5, a voltmeter 6, and probes 7, 8. The ammeter 5 is connected in series with the direct-current power supply 4. The voltmeter 6 is connected in parallel with the direct-current power supply 4. The output voltage VS of the direct-current power supply 4 is variable. The direct-current power supply 4 is used to apply the output voltage VS to the secondary battery 1 as will be described later. The ammeter 5 is used to measure a circuit current IB flowing through the circuit 3. The voltmeter 6 is used to measure a voltage between the probes 7, 8. In FIG. 2, the circuit 3 is made by connecting the probes 7, 8 of the measuring device 2 respectively to the terminals 50, 60 of the secondary battery 1.

A parasitic resistance Rx is further present in the circuit 3 in FIG. 2. The parasitic resistance Rx includes not only conductor resistances of components of the measuring device 2 but also a contact resistance between the probe 7 and the terminal 50 and a contact resistance between the probe 8 and the terminal 60. In FIG. 2, the parasitic resistance Rx is present in just like only in the probe 7-side conductor; however, it is merely for the sake of convenience of drawing. Actually, the parasitic resistance Rx is present all over the circuit 3.

In the test method using the measuring device 2, a self-discharge amount of the secondary battery 1 is checked. The secondary battery 1 is regarded as a defective product when the self-discharge amount is large and is regarded as a non-defective product when the self-discharge amount is small. Therefore, first, the secondary battery 1 is charged before being connected to the circuit 3. The charged secondary battery 1 is connected to the circuit 3, and the circuit current IB is measured by the measuring device 2 in this state. A flow pattern of the circuit current IB reflects a self-discharge amount of the secondary battery 1. Therefore, the condition of the secondary battery 1 is determined based on the state of the circuit current IB.

Specifically, the charged secondary battery 1 is connected to the circuit 3. At this time, the charged secondary battery 1 to be connected to the circuit 3 is the one that has completed up to high-temperature aging that is usually applied after being charged and, as a result, the battery voltage is stabilized. However, the test itself of the present embodiment is carried out at ordinary temperatures. The secondary battery 1 charged and subjected to high-temperature aging is connected to the circuit 3, and then the output voltage VS of the measuring device 2 is brought into coincidence with the battery voltage VB of the secondary battery 1. At this time, the circuit current IB is zero. When left standing as it is, the circuit current IB gradually increases. This is because the battery voltage VB gradually decreases because of the self-discharge of the secondary battery 1 and the output voltage VS becomes higher accordingly.

An increase in the circuit current IB due to the self-discharge of the secondary battery 1 converges with time. The magnitude of a converged circuit current IBs increases as the self-discharge amount of the secondary battery 1 increases. Therefore, by setting a reference value IK for the converged circuit current IBs in advance, it is possible to determine the condition of the secondary battery 1. A required processing time in such a test method is shorter than a standing time in the technique described in the background art. In addition, current measurement is employed, so determination accuracy is high.

It does not mean that the output voltage VS of the measuring device 2 after the secondary battery 1 is connected to the circuit 3 needs to coincide with the initial battery voltage VB of the secondary battery 1. The output voltage VS may be increased to be a further higher voltage after the test is started. Alternatively, the output voltage VS may be set to a voltage slightly higher than the initial battery voltage VB from the beginning and then further increased from that voltage. When the test is carried out at a higher output voltage VS, an increase in the circuit current IB is also quick accordingly. Therefore, a required processing time using the test method may be expected to be further shortened. However, when the output voltage VS is high, stability after an increase in the circuit current IB is poor. In other words, the range of fluctuations due to a disturbance after an increase in the circuit current IB is large. It is difficult to eliminate a disturbance, so it is difficult to determine whether the circuit current IB has converged, and it is also difficult to appropriately set the value of the converged circuit current IBs.

This point will be further described. In the present embodiment, as shown in FIG. 2, consideration is made with the concept of an imaginary resistance Rim in the circuit 3. The imaginary resistance Rim has a negative or zero resistance value. In the circuit diagram of FIG. 2, the imaginary resistance Rim is inserted in series with the parasitic resistance Rx. Although such a resistance is not actually present, consideration is made by replacing a situation in which the output voltage VS is increased with a model in which the output voltage VS is made constant and, instead, the absolute value of the resistance value of the imaginary resistance Rim is increased. However, the sum of the parasitic resistance Rx and the imaginary resistance Rim should be positive although the sum is reduced. Hereinafter, the sum of the parasitic resistance Rx and the imaginary resistance Rim is referred to as pseudo-parasitic resistance Ry. A circuit current in the model in which the pseudo-parasitic resistance Ry is introduced is expressed by the following expression (1).

$$IB=(VS-VB)/Ry \qquad (1)$$

Interpretation of the expression (1) in the case where consideration is made by using the model having the imaginary resistance Rim will be as follows. As described above, it is apparent that the circuit current IB is zero when the output voltage VS is initially brought into coincidence with the battery voltage VB. When the circuit current IB increases thereafter, an increase in the output voltage VS is regarded that the output voltage VS is constant and, instead, the pseudo-parasitic resistance Ry reduces. When the order of reduction in the pseudo-parasitic resistance Ry is large, that is, when the pseudo-parasitic resistance Ry is close to zero, the rate of increase in the circuit current IB is also high. This is actually a state where the output voltage VS is increased as described above and is also a state where the range of fluctuations in the circuit current IB is large. The reason why the range of fluctuations in the circuit current IB is large is because, by referring to the expression (1), the denominator of the right-hand side is close to zero.

Figure 4:
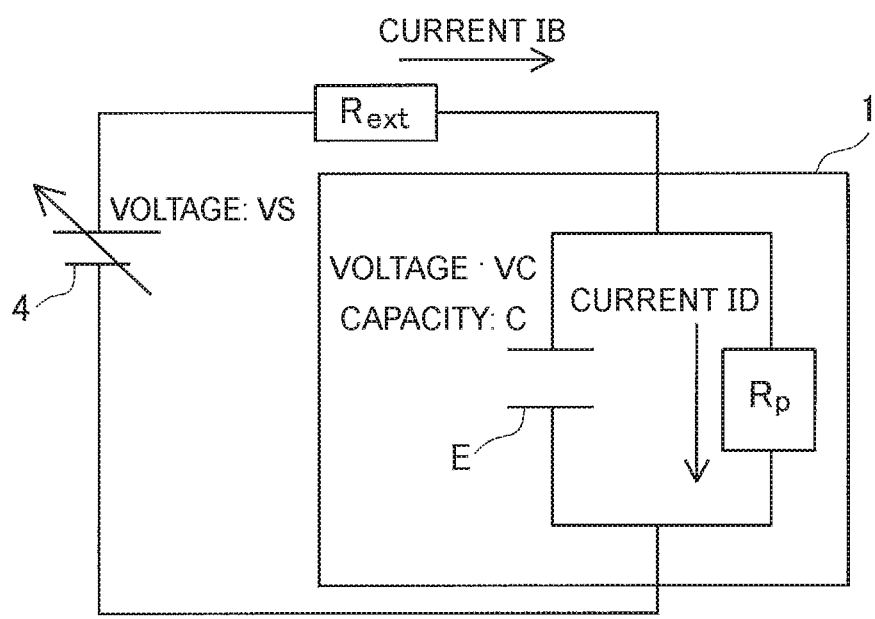
FIG. 4 is an equivalent circuit diagram for illustrating a circuit current in a circuit in the embodiment.

This will be further described with reference to FIG. 4. In the equivalent circuit of FIG. 4, the parasitic resistance Rx and the internal resistance Rs of the secondary battery 1 are collectively shown as "Rext" (circuit resistance). In FIG. 4, the voltage (cell voltage) of the electromotive element E of the secondary battery 1 is shown as "VC", and the capacity thereof is shown as "C". The battery voltage VB is the one incorporating a voltage drop that occurs in the internal resistance Rs due to the circuit current IB into the cell voltage VC.

$$IB = \frac{R_{ext} + R_p}{R_{ext} \cdot R_p} \cdot \left(\frac{R_p \cdot VS}{R_{ext} + R_p} - VC\right) \cdot \varepsilon + \\ \frac{VS}{R_{ext} + R_p} - \left(\frac{VS}{R_{ext} + R_p} - \frac{VC}{R_p}\right) \cdot \varepsilon \quad (2)$$

$$\varepsilon = \exp\left(-\frac{R_{ext} + R_p}{R_{ext} \cdot R_p \cdot C} t\right)$$

It is empirically known that the circuit current IB in the equivalent circuit of FIG. 4 is expressed by the expression (2). In the expression (2), "t" denotes an elapsed time from when energization of the circuit 3 is started. After a convergence of the circuit current IB given by the expression (2), it may be assumed that the circuit current IB is equal to a short-circuit current ID. This is because, in the circuit of FIG. 4, after a convergence of current, a discharge of the electromotive element E is stopped in effect, and the circuit current IB is directly the short-circuit current ID that passes through the short-circuit resistance Rp in the secondary battery 1.

The speed of convergence of the circuit current IB is found from the exponent of $\varepsilon$ in the expression (2). The speed of convergence is given by the expression (3).

$$\frac{R_{ext} + R_p}{R_{ext} \cdot R_p \cdot C} \quad (3)$$

$$\frac{1}{R_{ext} \cdot C} \quad (4)$$

$$\frac{\frac{R_{ext}}{R_p} + 1}{R_{ext} \cdot C} \quad (5)$$

When the secondary battery 1 is a non-defective product, Rext is sufficiently smaller than Rp, so the expression (3) may be rewritten as the expression (4) by omitting Rp from the expression (3). When the secondary battery 1 is a defective product, Rp cannot be omitted, and the expression (3) will be the expression (5). When the secondary battery 1 is a defective product, the speed of convergence is higher by the first term of the numerator than the speed of convergence when the secondary battery 1 is a non-defective product. It is understood that this is due to contribution of the short-circuit current ID that passes through the short-circuit resistance Rp. However, this does not mean that a required time to reach a convergence in the case of a defective product is shorter than that in the case of a non-defective product. A converged value of the circuit current IB in the case of a defective product is greater than that in the case of a non-defective product.

It is also found that the speed of convergence increases as the circuit resistance Rext reduces regardless of whether the secondary battery 1 is a non-defective product or a defective product. This means that a required time to reach convergence when the circuit resistance Rext is small is shorter than that when the circuit resistance Rext is large. The reason why it is possible to shorten a determination period by introducing the imaginary resistance Rim (that is, increasing the output voltage VS) as described above is because of this. In the expression (2) as well, the fact that the circuit resistance Rext is small is that the denominator is small, so this agrees to the fact that the range of fluctuations in the circuit current IB is large.

In the present embodiment, as measures for fluctuations in the circuit current IB, energization using the measuring device 2 after the secondary battery 1 is connected to the circuit 3 is separated into a first energization process and a second energization process. In the initial first energization process, it is intended to early converge the circuit current IB. Therefore, as described above, the output voltage VS is set to a voltage higher than the initial battery voltage VB. After that, the output voltage VS is decreased at the time when it is determined that the circuit current IB has converged. Thus, the circuit current IB is stabilized, and the condition of the secondary battery 1 is determined in this state.

Figure 5:
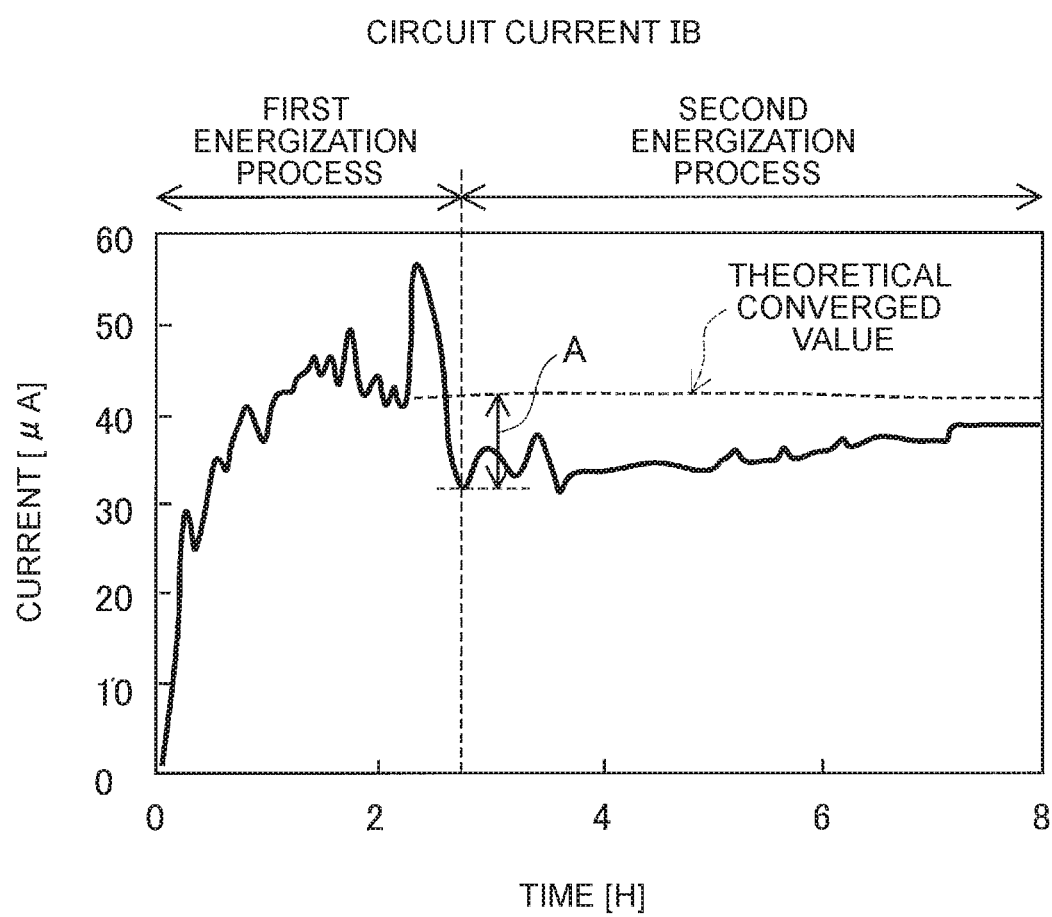
FIG. 5 is a graph showing changes in circuit current through a first energization process and a second energization process in the embodiment.

FIG. 5 shows an example of changes in circuit current IB through the first energization process and the second energization process. In this example, the circuit current IB steeply rises from the initial stage of the first energization process. This is the influence of the output voltage VS set to a relatively high value. For this reason, in this example, an increase in the circuit current IB apparently slows down about a little shorter than two hours after the start of the first energization process. However, after that, the circuit current IB significantly fluctuates up and down in a short cycle. This corresponds to the above-described situation in which the stability of the circuit current IB is poor. In the example of FIG. 5, the first energization process transitions into the second energization process in about a little shorter than three hours after the start of the first energization process. As a result of the transition, the range of fluctuations in the circuit current IB almost settles down. This is because, when described by using the expression (1), the denominator on the right-hand side has increased.

The first energization process will be further described. In the first energization process, Ry (pseudo-parasitic resistance) in the expression (1) may be reduced as much as possible. In other words, Ry (pseudo-parasitic resistance) may be reduced to such an extent that the absolute value of the imaginary resistance Rim is substantially equal to the parasitic resistance Rx. Since the imaginary resistance Rim is not actually present, this is actually achieved by increasing the output voltage VS of the direct-current power supply 4.

An increase from the state where the output voltage VS is brought into coincidence with the battery voltage VB is the absolute value of the product of the circuit current IB and the imaginary resistance Rim. In this situation, it may be assumed that the absolute value of the imaginary resistance Rim is equal to the parasitic resistance Rx. Therefore, when the parasitic resistance Rx is measured in advance, it is possible to determine an increase in the output voltage VS by multiplying the parasitic resistance Rx by the circuit current IB. Thus, the output voltage VS in the first energization process is determined.

The value of the circuit current IB at that time may be the converged circuit current IBs in the case where the secondary battery 1 is a non-defective product and the output voltage VS remains coincident with the initial battery voltage VB. The output voltage VS may be increased by the above-described increase from the same voltage as the battery voltage VB after the start of the first energization process, or the first energization process may be started by using the output voltage VS increased by that increase from the beginning.

In the first energization process, determination as to whether to transition into the second energization process is constantly performed. A transition condition for the determination is set in advance, and the details will be described later. When it is determined that the transition condition is satisfied, the process transitions into the second energization process. In other words, the reduced pseudo-parasitic resistance Ry is increased. Actually, the increased output voltage VS is decreased. In this way, the circuit current IB becomes stable in the second energization process, so the condition of the secondary battery 1 is determined in the second energization process.

However, as is shown in FIG. 5, the circuit current IB once reduces at the time of the transition ("A" in FIG. 5). Therefore, a certain period is required from when the circuit current IB gently increases thereafter to when the circuit current IB reaches a converged value. Of course, a required time for the circuit current IB to reach a converged value after the transition extends as a reduction in the circuit current IB at the time of the transition increases. A reduction in the circuit current IB at the time of the transition increases as a decrease in the output voltage VS at the time of the transition increases. For this reason, not so increasing a decrease in the output voltage VS at the time of the transition is advantageous in shortening a required time in total from the start of the first energization process. Of course, when a decrease in the output voltage VS at the time of the transition is too small, it may be inconvenient that fluctuations in the circuit current IB do not completely settle down even in the second energization process.

Figure 6:
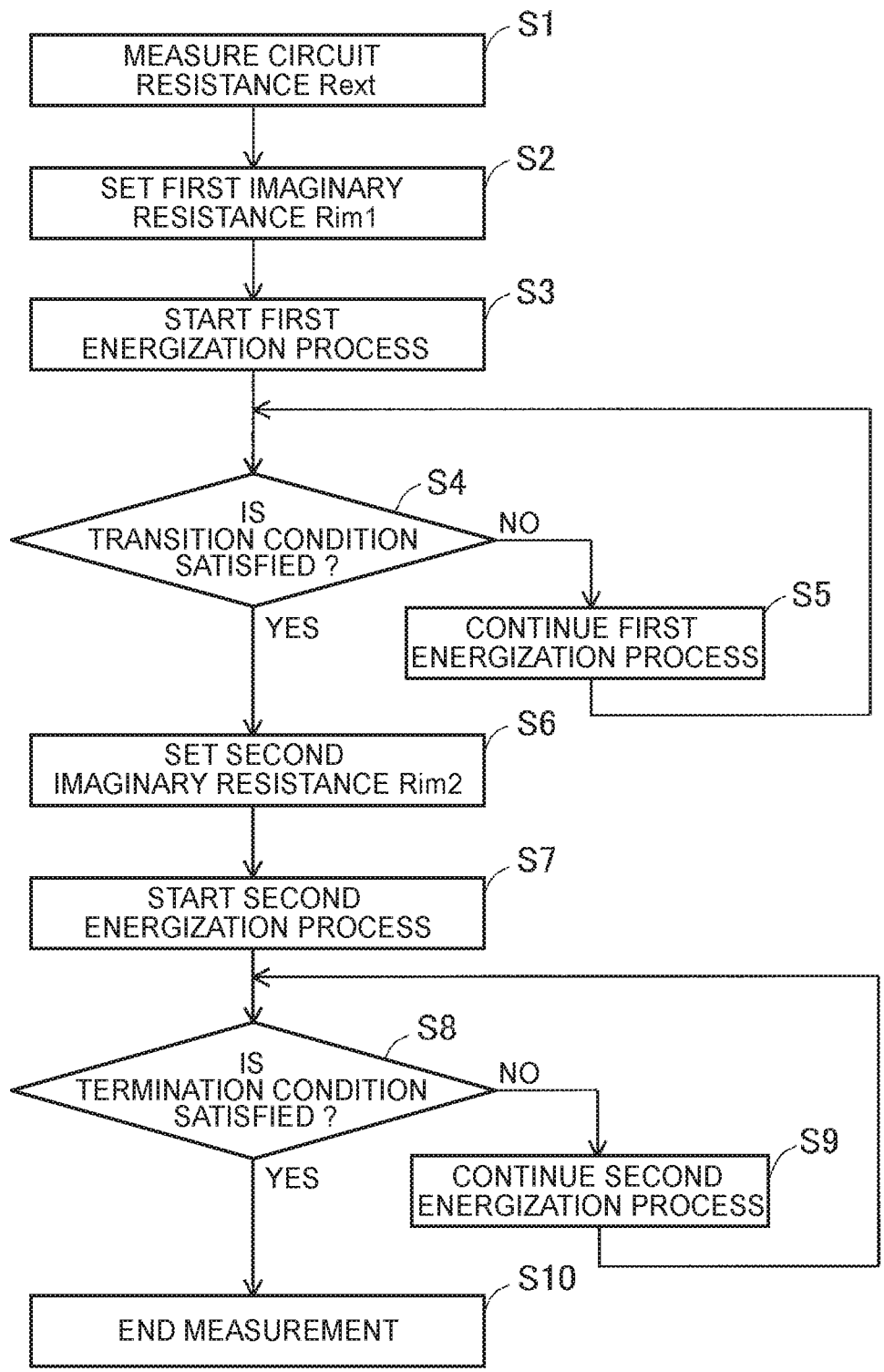
FIG. 6 is a flowchart showing details of control over a measuring device in the embodiment.

A control flow of the measuring device 2 for appropriately performing the above-escribed first energization process and second energization process will be described with reference to FIG. 6. In the flow of FIG. 6, initially, the circuit resistance Rext of the circuit 3 is measured (S1). This measurement is performed before the first energization process in a state where the circuit of FIG. 2 is assembled. Specifically, for example, the circuit resistance Rext may be measured with the method described in Japanese Unexamined Patent Application Publication No. 2019-138757 (JP 2019-138757 A). The circuit resistance Rext to be measured is the sum of the parasitic resistance Rx and the internal resistance Rs in FIG. 2.

When the circuit resistance Rext is measured, a first imaginary resistance Rim1 that is a resistance value to be used in the first energization process as the imaginary resistance Rim is set (S2). A value to be set as the first imaginary resistance Rim1 is any negative number of which the absolute value does not exceed the value of the circuit resistance Rext. The first imaginary resistance Rim1 is, of course, a parameter that defines a degree to which the output voltage VS is increased in the first energization process. Specifically, the first imaginary resistance Rim1 just needs to be set to a value slightly lower than the circuit resistance Rext measured in S1. The product of the set first imaginary resistance Rim1 and the circuit current IB to be calculated by the expression (2) is an actual increase in output voltage VS in the first energization process.

When the first imaginary resistance Rim1 is set, the first energization process is started (S3). In the first energization process, the condition of the secondary battery 1 is not determined, but it is constantly determined whether the transition condition is satisfied (S4). The transition condition is a condition for causing the first energization process to transition into the second energization process. In other words, the transition condition is a condition based on which it is determined that the circuit current IB is close to a convergence when the above-described fluctuations are removed from the circuit current IB in the first energization process. This condition is set in advance, and the details will be described later. When the transition condition is not satisfied (No in S4), the first energization process is continued (S5).

When the transition condition is satisfied while the first energization process is being continued (Yes in S4), the first energization process transitions into the second energization process. Therefore, a second imaginary resistance Rim2 that is a resistance value to be used as an imaginary resistance Rim in the second energization process is set (S6). A value to be set as the second imaginary resistance Rim2 is any negative number of which the absolute value is smaller than the first imaginary resistance Rim1. Details of setting of the second imaginary resistance Rim2 will be described later.

When the second imaginary resistance Rim2 is set, the first energization process is terminated, and the second energization process is started (S7). In the second energization process, the circuit current IB is measured, and it is constantly determined whether a termination condition is satisfied (S8). The termination condition is a condition for terminating measurement of the circuit current IB to determine the condition of the secondary battery 1. The termination condition is basically a condition based on which it is determined that there is no change in the circuit current IB. This condition is set in advance, and the details will be described later. When the termination condition is not satisfied (No in S8), the second energization process is continued (S9).

When the termination condition is satisfied while the second energization process is being continued (Yes in S8), the second energization process is terminated (S10). In other words, measurement of the circuit current IB is ended. The circuit current IB at the time of the termination is a converged value. When the converged value is less than or equal to a transition reference value set in advance, the secondary battery 1 is a non-defective product; otherwise, the secondary battery 1 is a defective product. The flow of FIG. 6 is as described above.

The above-described transition condition will be described. Various conditions that will be described below may be set as the transition condition, and any of the conditions is applicable. Specific numeric values that will be mentioned in the following description are those in the case where the secondary battery 1 is a lithium ion secondary battery.

Elapsed Time

An elapsed time from the start of the first energization process may be used as a transition condition. For example, assuming that it is known that, when the non-defective secondary battery 1 having a battery capacity of 4.5 Ah is energized with a pseudo-parasitic resistance Ry of 0.1Ω, a convergence time of the circuit current IB in the case where there is no disturbance is 30 minutes. In this case, even when a disturbance is inevitable in actual measurement, it is not necessary to perform the first energization process for over 30 minutes. Therefore, 30 minutes or a time slightly shorter than 30 minutes may be set as a transition condition for an elapsed time from the start of the first energization process. With this configuration, negative determination is made in S4 of FIG. 6 while an elapsed time does not reach the elapsed time set as the transition reference value, and affirmative determination is made when an elapsed time reaches the set elapsed time. When an elapsed time is used as the transition condition in this way, the circuit current IB may be measured or may be not measured in the first energization process.

Absolute Value of Circuit Current IB

For example, assuming that it is known that, in the case of the non-defective secondary battery 1 having a battery capacity of 4.5 Ah, the converged value of the circuit current IB is about 100 μA. In such a case, the absolute value of the circuit current IB may be used as the transition condition. In other words, a transition reference value is set for the value of the circuit current IB in advance. When the value of the circuit current IB measured by the ammeter 5 reaches or exceeds the transition reference value, it is determined that the transition condition is satisfied. Since the circuit current IB in the first energization process has the above-described fluctuations, there are variations as will be illustrated below in setting of the transition reference value and its determination method.

A method in which the transition reference value is set so as to be higher than a converged value and a measured value of the circuit current IB is directly compared with the transition reference value.

A method in which the transition reference value is set to near a converged value and a representative value (an average value, a median value, or the like) of multiple measured values of circuit current IB is compared with the transition reference value.

A method in which the transition reference value is set to near a converged value and an average of a peak value and a bottom value that are adjacent in time series of the circuit current IB is compared with the transition reference value.

A method in which the transition reference value is set so as to be lower than a converged value and a bottom value of the circuit current IB is compared with the transition reference value.

A method in which the transition reference value is set to near a converged value, a reference number of times is further set, and it is determined that the transition condition is satisfied when the number of times a measured value of the circuit current IB changes from a smaller side to a larger side with respect to the transition reference value reaches the reference number of times.

Rate of Increase in Circuit Current IB

Assuming that it is known that the initial rate of increase per unit time in the circuit current IB in the case where there is no disturbance in the first energization process is about 100 μA/minute. In this case, the rate of increase per unit time in the circuit current IB may be used as the transition condition. In other words, a transition reference value is set for the rate of increase per unit time in the circuit current IB in advance. A value lower than the above-described rate of increase is set in advance as the transition reference value. It is determined that the transition condition is satisfied when an average rate of increase in a period over one cycle or more of fluctuations of the circuit current IB becomes lower than the transition reference value.

A standard change in the circuit current IB in the case where there is no disturbance is calculated from the expression (2). As the difference between an actually measured value of the circuit current IB and a calculated value from the expression (2) increases, it is understood that it is in a situation that the influence of fluctuations, that is, a disturbance, is large. The fact that the influence of fluctuations is large means that the net rate of increase in the circuit current IB, excluding fluctuations, is decreasing, that is, approaching a convergence. Thus, a transition reference value may be set in advance for the difference between an actually measured value of the circuit current IB and a calculated value from the expression (2). It is determined that the transition condition is satisfied when the difference exceeds the transition reference value.

Battery Temperature

When a group of secondary batteries 1 having the same manufacturing history is subjected to the test, the secondary battery 1 that indicates a circuit current IB extremely greater than a median value of the circuit currents IB of the secondary batteries 1 in the group is regarded as a defective product regardless of whether the converged value of the circuit current IB is any value. For example, 20 μA is used as the transition reference value for the difference with respect to the median value of the circuit currents IB therefor. However, for such a determination is reasonable, it is sought that the standard deviation of the circuit current IB of each secondary battery 1 in the group is not excessively large (within a third of the transition reference value of the difference).

As a factor of causing the individual difference of the circuit current IB even for the secondary batteries 1 in the same group, temperature differences among individual secondary batteries 1 are conceivable. Particularly, the influence tends to appear in a situation in which the output voltage VS is intentionally increased as in the case of the first energization process of the present embodiment. Therefore, when there is a larger temperature difference as compared to the temperature histories of the other secondary batteries 1 in the group at the time of the determination, the output voltage VS should be decreased to reduce the influence, that is, the first energization process should be caused to transition into the second energization process. Such a situation itself indicates that a convergence of the circuit current IB in that secondary battery 1 is approaching.

Therefore, a transition condition may be set for a battery temperature. A transition condition to be set is a temperature difference with respect to the temperature histories in the first energization process among the other secondary batteries 1 in the group. For example, 0.1° C. may be set for the above-described condition as a temperature difference. Thus, when the fact that the temperature difference exceeds 0.1° C. is detected, it is determined that the transition condition is satisfied. In this case, the intended secondary battery 1 is excluded from determination as to the median value of the circuit currents IB of the secondary batteries 1 in the group, and the condition of that secondary battery 1 is determined only based on a converged value of the circuit current IB. To perform such a determination, it is, of course, necessary to measure the temperatures of the secondary batteries 1.

Rate of Change in Battery Temperature

When there is some sort of large disturbance in the middle of the first energization process, fluctuations in the circuit current IB become larger than usual thereafter. Therefore, it may be better to transition into the second energization process without waiting for fulfillment of other transition conditions. The influence of a disturbance also appears as a steep change in battery temperature. Therefore, it is better to set a transition condition for the rate of change per unit time in battery temperature. When the temperature of the secondary battery 1 has changed at a rate of change that exceeds a transition reference value set in advance, it is determined that the transition condition is satisfied.

Battery Capacity

A theoretical value of the circuit current IB is given by the expression (2), and a battery capacity C is included in the expression (2). Therefore, the circuit current IB receives the influence of the battery capacity C of the secondary battery 1. More specifically, as the battery capacity C increases, the rate of increase in circuit current IB decreases. In other words, a required time to reach convergence is long. There are individual differences in battery capacity C among the secondary batteries 1 in the same group. Thus, when the battery capacity C is measured in advance, it is possible to adjust setting of the above-described Elapsed Time based on the measured value. A transition reference value is extended for the secondary batteries 1 having a larger battery capacity C in a group, and a transition reference value is shortened for the secondary batteries 1 having a smaller battery capacity C in the group. With this configuration, it is possible to perform appropriate transition suitable for an individual difference in battery capacity C.

Circuit Resistance Rext

Similarly, the circuit resistance Rext is also included in the expression (2) and is also a factor that influences the circuit current IB. Particularly, since the circuit resistance Rext is included as a denominator in the exponential function, a required time to reach the convergence of the circuit current IB extends as the circuit resistance Rext increases. In addition, the circuit resistance Rext varies each time the secondary battery 1 is connected to the circuit 3. For this reason, when the circuit resistance Rext is measured before the first energization process is started, it is possible to adjust setting of the above-described Elapsed Time based on the measured value. A transition reference value is extended when the circuit resistance Rext is a larger value, and a transition reference value is shortened when the circuit resistance Rext is a smaller value. Thus, it is possible to perform appropriate transition suitable for a state of connection between the circuit 3 and the secondary battery 1.

Difference from Median Value of Circuit Currents IB

A difference of each individual circuit current IB from a median value of the circuit currents IB of the secondary batteries 1 of a group, mentioned in the above battery temperature, may be used as a transition condition by itself. In the case of the above-described example, a difference 20 µA just needs to be set as a transition reference value. When this transition condition is used, the first energization process is performed in parallel over the secondary batteries 1 of one group. As for an average value of circuit current IB in a period over one cycle or more of fluctuations, an individual difference relative to a median value in the group is subjected to determination. When the secondary battery 1 that indicates a difference exceeding 20 µA appears, the first energization process transitions into the second energization process only in that secondary battery 1 in advance of the others. As for the remaining secondary batteries 1, the first energization process transitions into the second energization process at the time when any one of the other transition conditions as described above is satisfied. A difference relative to another representative value, such as an average value, may be used.

Standard Deviation of Circuit Current IB in Group

When the first energization process is performed in parallel over the secondary batteries 1 of a group, the standard deviation of the circuit current IB of each secondary battery 1 may be used as a transition condition. As described in battery temperature, a situation in which variations in circuit current IB in a group by itself may be an appearance of any disturbance, and fluctuations in each circuit current IB are estimated to further increase thereafter. In the above-described example, a third of 20 µA is an upper limit of a usually desired standard deviation. Therefore, it is better to set 13.3 µA that corresponds to twice as large as the upper limit of the standard deviation as a transition reference value. When the standard deviation of a circuit current IB in a group reaches the transition reference value, the first energization process transitions into the second energization process all together for the secondary batteries 1 of the group regardless of the other transition conditions. An average value in a period over one or more cycles of fluctuations is desirably used as the circuit current IB of each secondary battery 1 in this case.

The transition condition is described above. Next, a decrease in output voltage VS at the time of transition from the first energization process to the second energization process will be described. Decreasing the output voltage VS at the time of transition means cancelling or reducing the output voltage VS that is increased in the first energization process. However, as described with reference to FIG. 5, it is desirable that a decrease in the output voltage VS at the time of the transition be not excessive.

Therefore, in the present embodiment, the battery voltage VB in the second energization process is determined by using the concept of the pseudo-parasitic resistance Ry. With this configuration, the decrease at the time of the transition does not become excessive. Assuming that a circuit resistance Rext actually measured in advance and described in the above Circuit Resistance Rext is, for example, 0.2Ω. This is a net value that does not include an imaginary resistance Rim. Assuming that the pseudo-parasitic resistance Ry in the first energization process is reduced to 0.1Ω in this state.

It is assumed that, in this case, the pseudo-parasitic resistance Ry in the second energization process is intermediate between the value during the first energization process and the initial net value, that is, for example, 5Ω. In other words, the second imaginary resistance Rim2 that is the imaginary resistance Rim in the second energization process is not set to zero and is set to a negative value of which the absolute value is smaller than the first imaginary resistance Rim1. Thus, while fluctuations in each circuit current IB that occurs in the first energization process are reduced, a reduction ("A" in FIG. 5) in the circuit current IB at the time of the transition does not become excessive. In this way, a total required time from the start of the first energization process to a convergence of the circuit current IB is shortened.

The pseudo-parasitic resistance Ry in the first energization process is referred to as first pseudo-parasitic resistance Ry1, and the pseudo-parasitic resistance Ry in the second energization process is referred to as second pseudo-parasitic resistance Ry2. At this time, a decrease VD in the output voltage VS at the time of the transition may be expressed by the expression (6). When the imaginary resistance Rim is used instead of the pseudo-parasitic resistance Ry, the expression (7) is obtained.

$$VD=IB \times (Ry2-Ry1) \quad (6)$$

$$VD=IB \times (Rim2-Rim1) \quad (7)$$

The circuit current IB in the expression (6) and the expression (7) may be a converged value theoretically obtained from the expression (2) instead of an actually measured value in the first energization process in which there are fluctuations. By setting imaginary resistances Rim in the first energization process and the second energization process in this way, it is possible to designate the decrease VD in the output voltage VS at the time of the transition. In the above-described flow of FIG. 6, setting of the second imaginary resistance Rim2 is performed in S6 (or before then), and the output voltage VS is dropped in S7 by the decrease VD determined as a result.

Next, the termination condition will be described. The termination condition is basically a condition as to whether it may be determined that a change in circuit current IB completely settles down. Some of the above-described transition conditions may be used as this condition. However, a termination reference value in the case of being used as a termination condition differs from a transition reference value in the case of a transition condition. Conditions that may be used as the termination condition are an elapsed time, a rate of increase in circuit current IB, a difference from a median value of circuit currents IB, and a standard deviation of a circuit current IB in a group.

Elapsed Time

As described in the above Elapsed Time for a transition condition, a convergence time in the case where the secondary battery 1 is a non-defective product mostly depends on the specifications of the secondary battery 1. Therefore, when a termination reference value is set for an elapsed time from the transition or a total elapsed time from the start of the first energization process, the termination reference value may be used as a termination condition. When a termination reference value for an elapsed time is used as a termination condition, the condition of the secondary battery 1 is determined after the termination of the second energization process. As determination criteria in this case, the absolute value of the circuit current IB at the time of the termination may be used. The condition of the secondary battery 1 may be determined based on whether the absolute value of the circuit current IB is smaller than or equal to an allowable value set in advance. The termination reference value for an elapsed time, as described in the transition condition, may be adjusted in accordance with a measured value of the battery capacity C of the secondary battery 1 or a measured value of the circuit resistance Rext.

Rate of Increase in Circuit Current IB

When the circuit current IB in the second energization process completely converges, the rate of increase per unit time in the circuit current IB is zero. Thus, this may be used as the termination condition. When the rate of increase in circuit current IB is used as the termination condition, a sampling period for calculating the rate of increase may be set regardless of the fluctuation cycle of the circuit current TB. However, the termination reference value for determining that the termination condition is satisfied is smaller than the transition reference value as the transition condition. When the rate of increase becomes lower than the termination reference value, it is determined that the termination condition is satisfied. After the termination, the condition is determined based on the absolute value of the circuit current IB at the time of the termination as in the case of the above. Alternatively, a limit value may be set for an elapsed time (from the transition or from the beginning) in advance. In this case, when the limit value of elapsed time is reached before the rate of increase in circuit current IB becomes lower than the termination reference value for the termination, it is determined that the secondary battery 1 is a defective product and the second energization process is terminated.

Difference from Median Value of Circuit Currents IB

When the first energization process and the second energization process are performed in parallel for the secondary batteries 1 of a group, an individual difference relative to a median value of the circuit currents IB in the group can occur even in the second energization process. Therefore, the difference may be used as the termination condition. When the difference is used as the termination condition, a sampling period of the circuit current IB of each individual secondary battery 1 may be set regardless of the fluctuation cycle of the circuit current IB. Alternatively, an actually measured value itself may be used. A termination reference value for the difference is smaller than a transition reference value in the case where a difference is used as a transition condition. When the secondary battery 1 that indicates a difference exceeding the termination reference value appears, the second energization process over only the secondary battery 1 is terminated in advance of the others, and it is determined that the secondary battery 1 is a defective product. For the remaining secondary batteries 1, the second energization process is terminated at the time when any one of the other termination conditions is satisfied, and are subjected to the determination. When a difference is used as a termination condition, a difference relative to another representative value, such as an average value, may be used.

Standard Deviation of Circuit Current IB in Group

When the first energization process and the second energization process are performed in parallel over the secondary batteries 1 of a group, the standard deviation of the circuit current IB of each secondary battery 1 may be used as a termination condition. A situation in which variations among circuit currents IB in the group are large means that a defective product is highly likely to be included in the group. A sampling period of the circuit current IB of each secondary battery 1 in the case where the termination reference value of the standard deviation is used as the termination condition may be set regardless of the fluctuation cycle of the circuit current IB. Alternatively, an actually measured value itself may be used. When the standard deviation of the circuit current IB in the group reaches the termination reference value, the second energization process over only the secondary battery 1 indicating the circuit current IB farthest from the others in the group is terminated in advance of the others, and it is determined that the secondary battery 1 is a defective product. The secondary battery 1 is excluded from the group. For the remaining secondary batteries 1, the second energization process is further continued. When another termination condition is satisfied before the standard deviation reaches the termination reference value, the second energization process is terminated, and subjected to the determination.

The termination condition is described above. The transition condition and the termination condition are not necessarily the same type. The transition condition and the termination condition may be different types. For the transition condition, multiple types may be used concurrently, and the first energization process may transition into the second energization process when any one of the transition conditions is satisfied. The same applies to the termination condition. The test method of the present embodiment may be performed as part of a manufacturing method for a secondary battery 1. In this case, after an initial charging process in which the secondary battery 1 structurally assembled by accommodating the electrode stack 20 and the electrolyte in the outer case 10 is initially charged to a state of charge set in advance to obtain a charged secondary battery 1, the test method of the present embodiment is performed.

As described above in detail, according to the present embodiment, in determining the condition of the secondary battery 1 by measuring a discharge current, the output voltage VS of the direct-current power supply 4 that applies an outer voltage to the secondary battery 1 is changed in the middle of measurement. In other words, the output voltage VS is increased in the first energization process that is the first half of measurement, and the output voltage VS is decreased in the second energization process that is the second half of the measurement. Thus, while a convergence of the circuit current IB of the secondary battery 1 is facilitated (first energization process), the circuit current IB becomes stable at the time of determining the condition (second energization process). With this configuration, it is possible to quickly determine the condition of the secondary battery 1 regardless of disturbance factors. When the test method of the present embodiment is performed as part of the manufacturing method for a secondary battery 1 as well, it is possible to shorten a processing time of the overall manufacturing method by shortening a processing time of the test method.

The present embodiment is only illustrative, and is not intended to limit the disclosure. Therefore, the disclosure may be implemented in various improvements or modifications without departing from the scope of the disclosure. For example, the overall energization process may be divided into three processes instead of two processes. In this case, the output voltage VS is decreased at the time of a transition from a first energization process to a second energization process and at the time of a transition from the second energization process to a third energization process. Determination as to a convergence of the value of the circuit current IB and determination as to the condition based on the converged circuit current IB are performed in the last third energization process. Alternatively, the overall energization process may be divided into four or more processes. The test method of the present embodiment is not limited to secondary batteries just after being manufactured as new products and may be applied to used secondary batteries for, for example, remanufacturing process for a used battery pack, or the like. An electrical storage device to be determined is not limited to secondary batteries and may be capacitors, such as electrical double-layer capacitors and lithium ion capacitors.

What is claimed is:

1. A test method for determining a condition of an electrical storage device under test based on a circuit current flowing through a circuit composed of the electrical storage device and a power supply connected to the electrical storage device, the test method comprising:
    performing a first energization process of applying a voltage with the power supply to cause a current for charging the electrical storage device to flow through the circuit composed of the charged electrical storage device and the power supply, and a second energization process of, when a predetermined transition condition is satisfied while the first energization process is being performed, decreasing the voltage of the power supply to cause the current to further flow; and
    by using a concept of an imaginary resistance value when a model in which it is assumed that the voltage output from the power supply in the first energization process is equal to a voltage of the electrical storage device and, instead, an imaginary resistance having a zero or negative resistance value is present in series with a parasitic resistance of the circuit and an absolute value of the imaginary resistance value is increased,
        setting an effective resistance value, which is a sum of the parasitic resistance value of the circuit and the imaginary resistance value, to $0.1\Omega$ or below;
        setting a decrease in the voltage of the power supply in transition from the first energization process to the second energization process such that the effective resistance value in the second energization process is an intermediate value between the parasitic resistance value of the circuit and the effective resistance value in the first energization process; and
        determining the condition of the electrical storage device in the second energization process.

2. The test method according to claim 1, wherein the transition condition includes at least one or two or more of following conditions,
    an elapsed time from a start of the first energization process has reached a predetermined transition reference value,
    an absolute value of the circuit current has reached a predetermined transition reference value in the first energization process,
    a rate of increase per unit time in the circuit current becomes lower than a predetermined transition reference value in the first energization process, and
    a rate of change per unit time in temperature of the electrical storage device has reached a predetermined transition reference value in the first energization process.

3. The test method according to claim 1, wherein:
    a group of electrical storage devices is subjected to the first energization process at a time; and
    the transition condition includes one or both of following conditions,
        a value of the circuit current becomes different by a predetermined transition reference value or more from a representative value in the group in the first energization process, and
        a standard deviation of a value of the circuit current in the group has reached a predetermined transition reference value in the first energization process.

4. The test method according to claim 1, wherein:
    when a predetermined termination condition is satisfied while the second energization process is being performed, the second energization process is terminated, and the condition of the electrical storage device is determined based on a value of the circuit current during the second energization process; and
    the termination condition includes one or two of following conditions,
        an elapsed time from a start of the first energization process or a transition into the second energization process has reached a predetermined termination reference value, and a rate of increase per unit time in the circuit current becomes lower than a predetermined termination reference value in the second energization process.

5. The test method according to claim 4, wherein:
a group of electrical storage devices is subjected to the first energization process and the subsequent second energization process at a time, and
the termination condition includes one or both of following conditions,
a value of the circuit current becomes different by a predetermined termination reference value or more from a representative value in the group in the second energization process, and
a standard deviation of a value of the circuit current in the group has reached a predetermined transition reference value in the second energization process.

6. A manufacturing method for an electrical storage device comprising:
an initial charging process of initially charging an assembled uncharged electrical storage device to a predetermined state of charge to obtain a charged electrical storage device; and
a test process of testing the charged electrical storage device, wherein, in the test process, the test method according to claim 1 is performed.

* * * * *